United States Patent
Landolt

(10) Patent No.: US 10,955,441 B2
(45) Date of Patent: Mar. 23, 2021

(54) MEASUREMENT SYSTEM AND METHOD FOR OPERATING A MEASUREMENT SYSTEM

(71) Applicant: Rohde & Schwarz GmbH & Co. KG, Munich (DE)

(72) Inventor: Oliver Landolt, Taufkirchen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 233 days.

(21) Appl. No.: 15/915,876

(22) Filed: Mar. 8, 2018

(65) Prior Publication Data
US 2019/0277887 A1    Sep. 12, 2019

(51) Int. Cl.
| | |
|---|---|
| G01R 13/02 | (2006.01) |
| H03K 5/135 | (2006.01) |
| H03K 5/14 | (2014.01) |
| G11C 27/02 | (2006.01) |
| H03K 5/00 | (2006.01) |

(52) U.S. Cl.
CPC ......... *G01R 13/0272* (2013.01); *H03K 5/135* (2013.01); *H03K 5/14* (2013.01); *G11C 27/02* (2013.01); *H03K 2005/0026* (2013.01); *H03K 2005/00078* (2013.01)

(58) Field of Classification Search
CPC ...... G01R 13/0272; H03K 5/14; H03K 5/135; H03K 2005/0026; H03K 2005/00078; G11C 27/02
USPC ........................................ 324/750.02; 327/93
See application file for complete search history.

(56) References Cited

U.S. PATENT DOCUMENTS

| | | | | |
|---|---|---|---|---|
| 4,647,795 A | * | 3/1987 | Agoston | G11C 27/026 327/379 |
| 2015/0222287 A1 | | 8/2015 | Tekin et al. | |

FOREIGN PATENT DOCUMENTS

EP        3113367 A1    1/2017

* cited by examiner

*Primary Examiner* — Farhana A Hoque
(74) *Attorney, Agent, or Firm* — Christensen O'Connor Johnson Kindness PLLC

(57) ABSTRACT

A measurement system is described, comprising a sampling clock unit, a travelling wave sampler circuit and at least a first analog-to-digital converter and a second analog-to-digital converter. The sampling clock unit is configured to generate a sampling timing for the travelling wave sampler circuit. The travelling wave sampler circuit is configured to receive an input signal. The travelling wave sampler circuit is further configured to provide at least a first time-discrete intermediate signal and a second time-discrete intermediate signal and to sample the first and the second time-discrete intermediate signal with the same sampling timing. The first analog-to-digital converter and the second analog-to-digital converter are configured to receive the first time-discrete intermediate signal sampled and the second time-discrete intermediate signal sampled, respectively. The first analog-to-digital converter and the second analog-to-digital converter are configured to output a first digitized output signal and a second digitized output signal, respectively. Further, a method for operating a measurement system is described.

19 Claims, 3 Drawing Sheets

MEASUREMENT SYSTEM AND METHOD FOR OPERATING A MEASUREMENT SYSTEM

TECHNICAL FIELD

Embodiments of the present disclosure relate to a measurement system as well as a method for operating a measurement system.

BACKGROUND

In the state of the art, oscilloscopes sample an analog input signal at regular time intervals successively in time so that different samples of the analog input signal are obtained in a successive manner. Typically, the analog input signal is forwarded to several sample-and-hold devices (sampler) wherein the sample-and-hold devices each receive a respective clock signal for sampling purposes. The several clock signals used for sampling have different phases wherein these clock signals may be provided by different sampling clocks. Each of the sampling clocks as well as the samplers themselves cause some jitter (inherent jitter) which cannot be avoided, for instance the inherent jitter is about 100 fs. In addition, the jitter occurring within the different samples is uncorrelated since several sampling signals or rather different sampling clocks are used. The inherent jitter of a sampling clock may also be called jitter noise floor.

It might be interesting to measure the jitter of a certain device under test, in particular a signal of the device under test. However, the jitter of the device under test may be lower than 100 fs and, thus, it is lower than the inherent (uncorrelated) jitter of the oscilloscope used for sampling the signal of the device under test.

Accordingly, the oscilloscopes known in the state of the art cannot be used for measuring the jitter of the analog input signal itself due to the (different) inherent jitter(s) related to the sampling clock(s).

So far, the inherent clock jitter of the oscilloscopes is already reduced by using low phase-noise oscillators for generating the respective clock signal for sampling. However, this technique can only reduce the clock jitter as it is not possible to reduce the phase noise to zero or at least insofar that the jitter of a device under test can be measured by using the oscilloscopes of the state of the art.

SUMMARY

Accordingly, there is a need for a possibility to measure jitter of a device under test in an efficient and accurate manner.

To address this need and/or others, embodiments of the present disclosure relate to a measurement system comprising a sampling clock unit, a travelling wave sampler circuit and at least a first analog-to-digital converter and a second analog-to-digital converter. The sampling clock unit is configured to generate a sampling timing for the travelling wave sampler circuit and the travelling wave sampler circuit is configured to receive an input signal. The travelling wave sampler circuit is also configured to provide at least a first time-discrete intermediate signal and a second time-discrete intermediate signal and to sample the first and the second time-discrete intermediate signal with the same sampling timing. The first analog-to-digital converter and the second analog-to-digital converter are configured to receive the first time-discrete intermediate signal sampled and the second time-discrete intermediate signal sampled, respectively; and the first analog-to-digital converter and the second analog-to-digital converter are configured to output a first digitized output signal and a second digitized output signal, respectively.

Accordingly, the analog input signal is converted into at least the first time-discrete intermediate signal and the second time-discrete intermediate signal by the travelling wave sampler circuit. Thus, the continuous input signal is converted into (at least two) time-discrete signals for further processing. Both time-discrete intermediate signals are processed by the travelling wave sampler circuit wherein the same sampling timing is applied to the time-discrete intermediate signals for sampling. Hence, uncorrelated jitter can be avoided so that it is ensured that both time-discrete intermediate signals have the same (relative) jitter of the sampling clock unit since the same sampling timing is used for the time-discrete intermediate signals. In other words, the time interval between the time-discrete intermediate signals obtained is not jitter-dependent.

An aspect provides that the travelling wave sampler circuit comprises a tapped delay line. Accordingly, the analog input signal is delayed appropriately when traveling along the tapped delay line. For instance, the tapped delay line provides N taps and a delay $\Delta t$ per tap. Each of the taps can be used for providing a respective time-discrete intermediate signal. Hence, N time-discrete intermediate signals may be provided by the N taps of the tapped delay line. These N time-discrete intermediate signals are sampled while using the same sampling time.

In some embodiments, a period of the sampling clock unit is equal to an overall delay time of the tapped delay line. Overall delay time of the tapped delay line corresponds to $N \cdot \Delta t$. Hence, it is ensured that all time-discrete intermediate signals can be obtained within one clock edge (rising edge or falling edge) of the sampling clock unit. In other words, all samples are acquired on the same clock edge which means they can be taken at the same time (simultaneously). As mentioned earlier, the time intervals between the time-discrete intermediate signals obtained do not depend on jitter as the same sampling timing is used for these time-discrete intermediate signals.

According to another aspect, the travelling wave sampler circuit comprises at least two sample-and-hold devices (samplers). The sample-and-hold devices may be time-interleaved. The number of sample-and-hold devices corresponds to the number of taps provided by the tapped delay line so that the same number of time-discrete intermediate signals can be sampled. The sample-and-hold devices receive the same sampling timing from the sampling clock unit, in particular simultaneously.

Furthermore, a signal processing unit may be provided, the signal processing unit being configured to receive and process the at least two digitized output signals. The signal processing unit can be established by a digital signal processing unit so that the digitized output signals can be evaluated in different ways. The digitized output signals can be used for further processing. Moreover, the digitized output signals may be evaluated or rather analyzed in a digital manner. For instance, the digitized output signals may be forwarded to another evaluation device.

In some embodiments, the signal processing unit is configured to generate a waveform based on the at least two digitized output signals, for example, a digitized waveform. The waveform may be generated by interpolating the time-discrete intermediate signals, for instance in a linear manner, by a low pass filter, by a gauss filter or in any other suitable manner.

Furthermore, the signal processing unit may be configured to detect predetermined events in the digitized output signals. The predetermined events may be a certain waveform (waveform characteristics) and/or time points of interest, for instance a time interval between at least a first time point of interest and a second time point of interest.

In some embodiments, the events are at least one of a certain waveform, crossing of a certain threshold and an extremum, for instance a local extremum. The local extremum may relate to a maximum or rather a minimum.

The signal processing unit may be configured to determine a time interval between at least two events. This time interval is jitter-free as long as the two events are obtained during the same clock edge since the same sampling timing is applied for sampling the input signal.

According to another aspect, the signal processing unit is configured to determine a statistic over a certain time interval. The time interval can be at least one of a simple time interval ($\Delta t$), a factorized time interval ($x \cdot \Delta t$), namely the time interval $\Delta t$ multiplied by an integer, or a clock period ($N \cdot \Delta t$). The respective statistic may be outputted to a display unit for illustrative purposes. For the statistics, measurements are done several times. Time intervals between points of interest are determined repetitively so that enough information for statistics is obtained.

In some embodiments, the statistic is a histogram. Hence, the user gets an overview in a fast manner regarding the signal measured and the statistics thereof, for instance the statistical frequency of certain events.

Further, embodiments of the present disclosure relate to a method for operating a measurement system, comprising the steps of:

receiving an input signal;

generating a first time-discrete intermediate signal from the input signal;

delaying the input signal at least once by a certain time interval;

generating a second time-discrete intermediate signal from the delayed input signal; and generating digitized output signals corresponding to the at least two time-discrete intermediate signals.

Accordingly, the analog input signal is delayed so that time-discrete intermediate signals can be generated which are used for further processing. For instance, the delaying is done by a tapped delay line which comprises several taps so that the input signal is delayed at least once in order to generate the second time-discrete intermediate signal being delayed with respect to the first time-discrete intermediate signal wherein both the first and second time-discrete intermediate signals originate from the same input signal.

A common sampling timing may be provided for generating the first and second time-discrete intermediate signal. Thus, the input signal is delayed wherein the same sampling timing is used so that two successive samples (time-discrete intermediate signals sampled) are obtained for further processing. Accordingly, the time interval between these time-discrete intermediate signals sampled is jitter-free as the same sampling timing was used. In other words, the relative time interval does not depend on the jitter of the sampling clock(s) since the same sampling timing is used for sampling the at least two time-discrete intermediate signals. However, the absolute time of both time-discrete intermediate signals may be a bit too early or a bit too late because of the sampling clock jitter.

The input signal may be delayed multiple times by a constant time interval. This can be done by a tapped delay line in an efficient manner so that multiple time-discrete intermediate signals can be obtained. As the multiple delaying results in multiple time-discrete intermediate signals sampled when the same sampling timing is applied, the constant time interval used for the delay may correspond to the usual "sampling rate".

Further, a waveform may be generated from the digitized output signals. The waveform may be generated by a signal processing unit, for example, a digital one. For instance, the signal processing unit interpolates the time-discrete intermediate signals obtained appropriately, in particular its samples.

Moreover, certain events may be detected in the digitized output signals. The events may relate to certain waveforms and/or points of interest, for instance time intervals between two points of interest.

In some embodiments, a time interval is determined between at least two of the events. This time interval is jitter-free as long as the events correspond to samples obtained by the same clock edge (rising or falling edge of the sampling clock unit). Hence, a time interval can be measured independently from sampling clock jitter(s) due to the fact that the same sampling timing was used for obtaining the respective samples comprising the at least two events.

Moreover, a statistic can be generated over at least two time intervals. For instance, the statistic is a histogram. The steps mentioned above, in particular the measuring and/or determining steps, can be repeated so that enough information is obtained which can be used for the statistics, for instance information of several time intervals.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
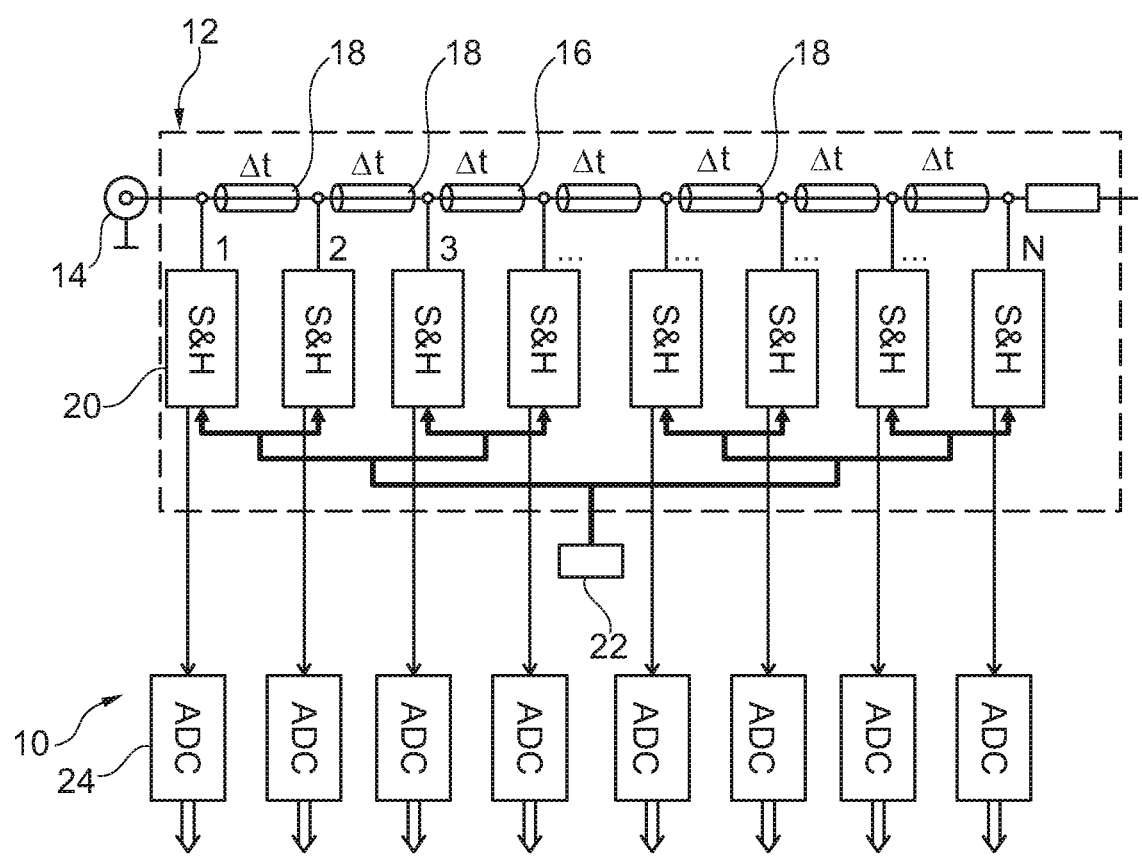
FIG. 1 schematically shows an overview of a measurement system according to an embodiment of the present disclosure.

In FIG. 1, a measurement system 10 is shown that may be integrated in a measurement instrument such as an oscilloscope. In the embodiment shown, the measurement system 10 comprises a travelling wave sampler circuit 12 that is connected to an input 14 via which an (analog) input signal is inputted for being processed by the measurement system 10.

In some embodiments, the travelling wave sampler circuit 12 comprises a tapped delay line 16 that is (directly) connected to the input 14. The tapped delay line 16 comprises several (or N) taps 18 wherein each tap 18 provides a delay $\Delta t$ per tap 18. Hence, the input signal processed by the tapped delay line 16 is delayed multiple times by a constant time interval, namely $\Delta t$. Accordingly, the overall delay of the tapped delay line 16 corresponds to N times $\Delta t$ (N·$\Delta t$) due to the N taps 18.

Each of the several (N) taps 18 generate a time-discrete intermediate signal wherein the time-discrete intermediate signals generated are each delayed by the time interval $\Delta t$ due to the taps 18 of the tapped delay line 16 as mentioned above. This means that the tapped delay line 16 delays the input signal subsequently.

Since the input signal is delayed multiple times by the constant time interval $\Delta t$, the several (N) taps 18 provide several (N) time-discrete intermediate signals that are forwarded to respective sample-and-hold devices 20 which are also called samplers. The sample-and-hold devices 20 are also part of the travelling wave sampler circuit 12 or operatively connected thereto.

For sampling the several time-discrete intermediate signals, one sampling timing is applied to the sample-and-hold devices 20 wherein the sampling timing is provided by a sampling clock unit 22.

The sampling timing provided by a sampling clock unit 22 may be periodically provided wherein the period corresponds to the overall delay time of the tapped delay line 16, namely N·$\Delta t$ due to the N taps 18 of the tapped delay line 16.

As indicated in FIG. 1, the same sampling timing is forwarded to the several sample-and-hold devices 20 such that the different samples are obtained simultaneously. Accordingly, no relative jitter occurs between the time-discrete intermediate signals (samples) obtained by the several sample-and-hold devices 20 since the same sampling timing is applied for sampling. The time-discrete intermediate signals sampled (samples) are forwarded to respective analog-to-digital converters 24 so that the analog signals are digitized for further processing.

The digitized signals, also called digitized output signals, may be forwarded to a (digital) signal processing unit 26 that is configured to process the digitized output signals appropriately. For instance, the signal processing unit 26 may generate a (digital) waveform based on the digitized output signals provided by the analog-to-digital converters 24. This can be done by interpolating the time-discrete intermediate signals sampled.

Alternatively or additionally, the signal processing unit 26 is configured to detect predetermined events in the digitized output signals, for instance a certain waveform (waveform characteristics), crossing of a certain threshold and/or an extremum, for instance a local extremum such as a local minimum or rather a local maximum.

Figure 2:
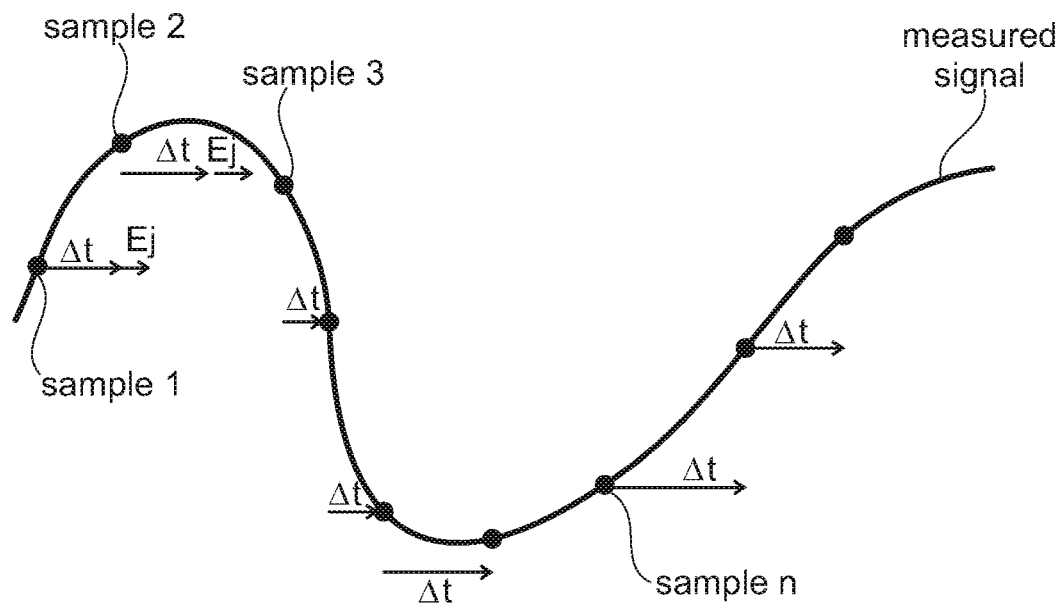
FIG. 2 schematically shows a diagram illustrating the sampling of a measured signal with a measurement system according to the present disclosure.

In some embodiments, the signal processing unit 26 is configured to determine a time interval between at least two events, for instance two points of interest as shown in FIG. 2 showing a diagram illustrating the sampling of an input signal. In the diagram, several samples are indicated. It is further shown that subsequent samples are obtained. Since the input signal is delayed by a constant time interval $\Delta t$ (delay time), the time interval between two successive samples corresponds to this delay time $\Delta t$ of the subsequent taps 18 as indicated in FIG. 2.

In addition, the diagram illustrates that a jitter indicated by $\varepsilon_j$ may occur. However, this jitter occurs for each of the several samples in the same manner since the several samples were obtained by the same sampling timing.

Hence, a time interval between two samples, for example, subsequent samples, can be measured accurately as the absolute jitter does not affect the determination of a time interval and no relative jitter occurs since the several samples were gathered by the same sampling timing as mentioned before, namely by the same clock edge (rising or falling edge of the sampling clock unit).

For increasing the plausibility, several measurements, for example, the determination of the time interval, can be repeated several times so that enough information is provided so that a histogram can be generated which may indicate the jitter of the input signal.

Accordingly, the measurement system 10 is enabled to determine the jitter of the signal provided by a device under test.

Figure 3:
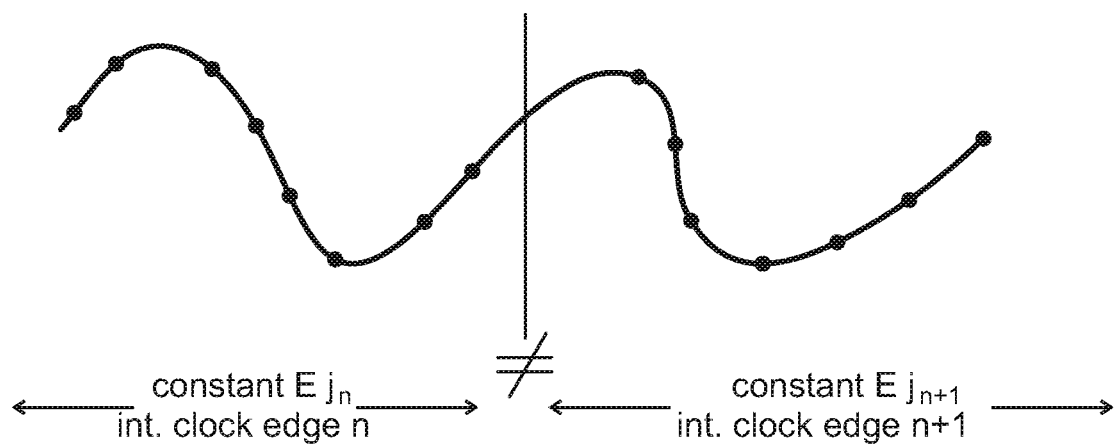
FIG. 3 schematically shows a diagram illustrating the sampling of a measured signal with a measurement system according to the present disclosure.

In FIG. 3, it is shown that the different samples obtained can be compared with each other in a jitter-free manner as long as they correspond to the same clock edge of the sampling clock unit 22. As indicated in FIG. 3, the samples obtained by the clock edge n comprise a jitter indicated by $\varepsilon_{jn}$ whereas the samples obtained by the clock edge n+1 comprise a jitter indicated by $\varepsilon_{jn+1}$ that might differ from the jitter of the clock edge n so that a relative jitter occurs between samples of different clock edges.

Figure 4:
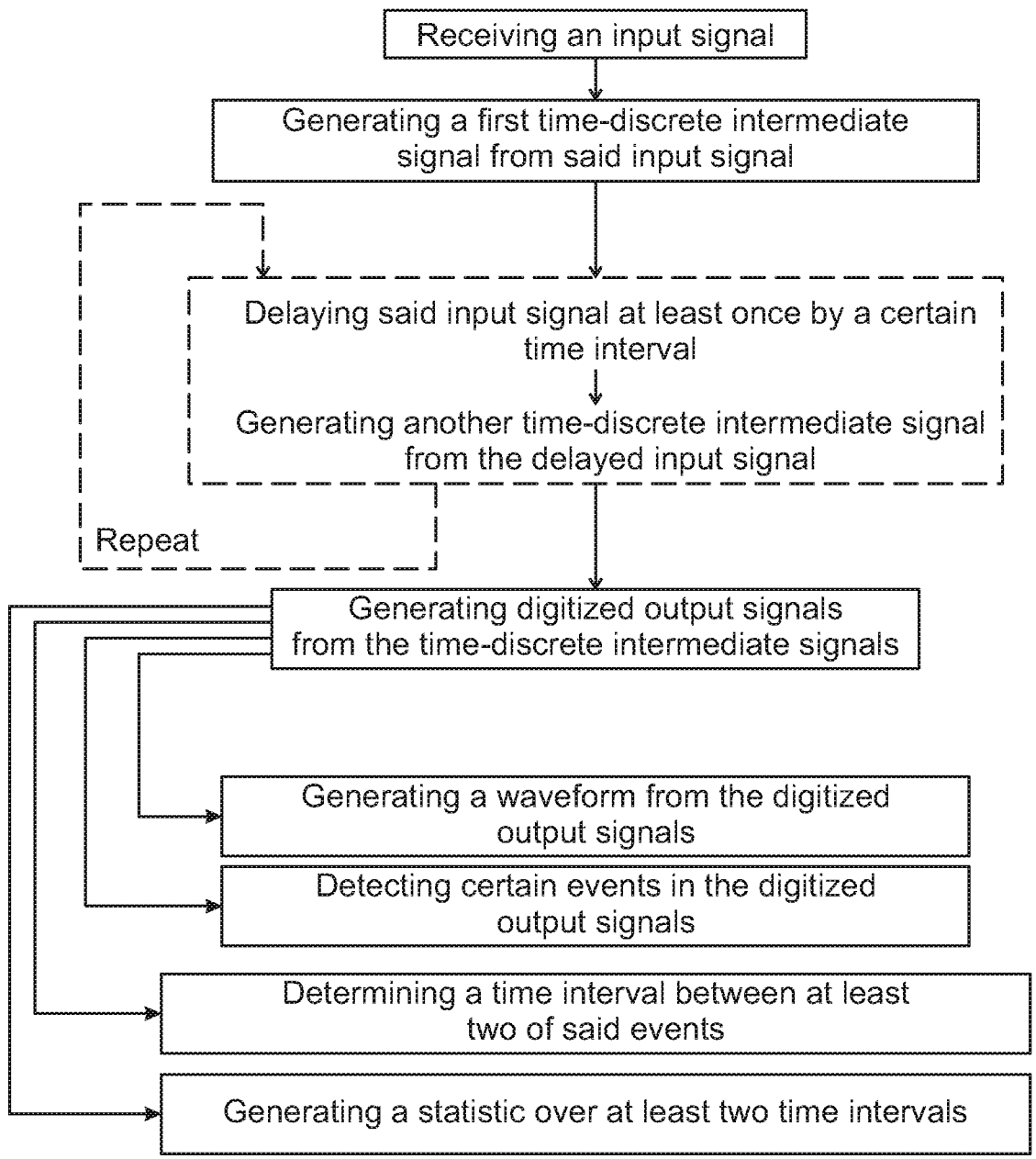
FIG. 4 schematically shows a flow-chart illustrating a method for operating a measurement system according to the present disclosure.

As indicated in FIG. 4, the signal of a device under test can be tested regarding a jitter by the measurement system 10 shown in FIG. 1 as described hereinafter. In the beginning, the signal of the device under test is inputted so that an input signal is received by the measurement system 10. This input signal is processed by the travelling wave sampler circuit 12, for example, the tapped delay line 16, so that a first time-discrete intermediate signal is generated. Then, the input signal travels along the tapped delay line 16 and is delayed appropriately so that a second time-discrete intermediate signal is generated. These steps, namely the delaying step and the step of generating another time-discrete intermediate signal, are repeated by the tapped delay line 16 for all taps 18 provided.

Thus, several (N) time-discrete intermediate signals are generated wherein the number of time-discrete intermediate signals corresponds to the number of taps 18 provided by the tapped delay line 16.

The time-discrete intermediate signals generated are forwarded to the sample-and-hold devices 20 connected to the taps 18 so that several samples are obtained when a sampling timing is provided by the sampling clock unit 22, for example, a clock edge (rising or falling edge) of the sampling clock unit 22. Accordingly, the several samples are obtained simultaneously while applying the same sampling timing so that no (relative) jitter occurs between the different samples.

As the input signal is delayed, the samples obtained relate to different portions of the input signal with regard to the time.

The samples obtained may be digitized by the analog-to-digital converters 24 so that digitized output signals are obtained which are forwarded to the signal processing unit 26 for further processing, for instance generating a (digital) waveform from the digitized output signals (by interpolating the digitized samples), detecting certain events in the digitized output signals, determining a time interval between at least two events (points of interest) and/or generating a statistic over at least two time intervals.

The signal processing unit 26 may include, in some embodiments, logic for implementing the technologies and methodologies described herein. This logic of the signal processing unit 26 can be carried out in either hardware or software, or a combination of hardware and software. In some embodiments, the signal processing unit 26 includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the signal processing unit 26 includes a microprocessor and a memory storing logic modules and/or instructions. In an embodiment, the signal processing unit 26 includes one or more ASICs having a plurality of predefined logic components. In an embodiment, the signal processing unit 26 includes one or more FPGA having a plurality of programmable logic components. In an embodiment, the signal processing unit 26 includes a digital signal processor (DSP) and associated logic modules and/or instructions. In an embodiment, the signal processing unit 26 includes hardware circuit implementations (e.g., implementations in analog circuitry, implementations in digital circuitry, and the like, and combinations thereof). In an embodiment, the signal processing unit 26 includes combinations of circuits and computer program products having software or firmware instructions stored on one or more computer readable memories that work together to cause the signal processing unit 26 to perform one or more methodologies or technologies described herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system comprising:
    a sampling clock unit, a travelling wave sampler circuit and at least a first analog-to-digital converter and a second analog-to-digital converter;
    the sampling clock unit being configured to generate a sampling timing for the travelling wave sampler circuit;
    the travelling wave sampler circuit being configured to receive an input signal;
    the travelling wave sampler circuit further being configured to provide at least a first time-discrete intermediate signal and a second time-discrete intermediate signal and to sample the first and the second time-discrete intermediate signal with the same sampling timing;
    the first analog-to-digital converter and the second analog-to-digital converter being configured to receive the first time-discrete intermediate signal sampled and the second time-discrete intermediate signal sampled, respectively; and
    the first analog-to-digital converter and the second analog-to-digital converter being configured to output a first digitized output signal and a second digitized output signal, respectively.

2. The measurement system according to claim 1, wherein the travelling wave sampler circuit comprises a tapped delay line.

3. The measurement system according to claim 2, wherein a period of the sampling clock unit is equal to an overall delay time of the tapped delay line.

4. The measurement system according to claim 1, wherein the travelling wave sampler circuit comprises at least two sample-and-hold devices.

5. The measurement system according to claim 1, wherein a signal processing unit is provided, the signal processing unit being configured to receive and process the at least two digitized output signals.

6. The measurement system according to claim 5, wherein the signal processing unit is configured to generate a waveform based on the at least two digitized output signals.

7. The measurement system according to claim 5, wherein the signal processing unit is configured to detect predetermined events in said digitized output signals.

8. The measurement system according to claim 7, wherein said events are at least one of a certain waveform, crossing of a certain threshold and an extremum.

9. The measurement system according to claim 7, wherein the signal processing unit is configured to determine a time interval between at least two events.

10. The measurement system according to claim 5, wherein the signal processing unit is configured to determine a statistic over a certain time interval.

11. The measurement system according to claim 10, wherein the statistic is a histogram.

12. The measurement system according to claim 1, wherein the first digitized output signal and the second digitized output signal each correspond to a time and value discrete sample.

13. A method for operating a measurement system, comprising the steps of:
    receiving an input signal;
    generating a first time-discrete intermediate signal from said input signal;
    delaying said input signal at least once by a certain time interval;
    generating a second time-discrete intermediate signal from the delayed input signal; and
    generating digitized output signals corresponding to the at least two time-discrete intermediate signals, wherein a first one of said digitized output signals is generated via a first analog to digital converter, and a second one of said digitized output signals is generated via a second analog to digital converter.

14. The method of claim 13, wherein a common sampling timing is provided for generating the first and second time-discrete intermediate signal.

15. The method of claim 13, wherein the input signal is delayed multiple times by a constant time interval.

16. The method of claim 13, further comprising the step of generating a waveform from the digitized output signals.

17. The method of claim 13, further comprising the step of detecting certain events in the digitized output signals.

18. The method of claim 17, further comprising the step of determining a time interval between at least two of said events.

19. The method of claim 13, wherein a statistic is generated over at least two time intervals.

\* \* \* \* \*